United States Patent
Oguz et al.

(10) Patent No.: US 12,495,559 B2
(45) Date of Patent: Dec. 9, 2025

(54) CAPACITOR WITH DUAL DIELECTRIC LAYERS

(71) Applicant: Intel Corporation, Santa Clara, CA (US)

(72) Inventors: Kaan Oguz, Portland, OR (US); I-Cheng Tung, Hillsboro, OR (US); Chia-Ching Lin, Portland, OR (US); Sou-Chi Chang, Portland, OR (US); Matthew V. Metz, Portland, OR (US); Uygar E. Avci, Portland, OR (US); Arnab Sen Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 930 days.

(21) Appl. No.: 17/483,795

(22) Filed: Sep. 23, 2021

(65) Prior Publication Data
US 2023/0087624 A1    Mar. 23, 2023

(51) Int. Cl.
*H10D 1/68*    (2025.01)
(52) U.S. Cl.
CPC .................. *H10D 1/694* (2025.01)

(58) Field of Classification Search
CPC .......... H10D 1/684; H10D 1/688; H10D 1/68; H10D 1/692; H10D 1/694; H10D 1/696
See application file for complete search history.

(56) References Cited

U.S. PATENT DOCUMENTS

| | | | |
|---|---|---|---|
| 2003/0060008 A1* | 3/2003 | Hong | H01L 21/32139 257/E21.011 |
| 2006/0073613 A1* | 4/2006 | Aggarwal | H10D 1/688 257/E21.664 |
| 2017/0365656 A1* | 12/2017 | Zelner | H01G 4/1254 |
| 2021/0020739 A1* | 1/2021 | Yeong | H01L 23/49827 |

* cited by examiner

*Primary Examiner* — Thanhha S Pham
(74) *Attorney, Agent, or Firm* — Schwabe, Williamson & Wyatt P.C.

(57) ABSTRACT

Embodiments described herein may be related to apparatuses, processes, and techniques related to increasing the capacitance density of MIM capacitors on dies or within packages. In particular, a MIM stack is disclosed that has multiple insulator layers between the metal, in order to increase the dielectric constant of the MIM stack. In particular, the first dielectric layer may include strontium, titanium, and oxygen and may be physically coupled with a second dielectric layer that may include barium, strontium, titanium, and oxygen. Other embodiments may be described and/or claimed.

14 Claims, 8 Drawing Sheets

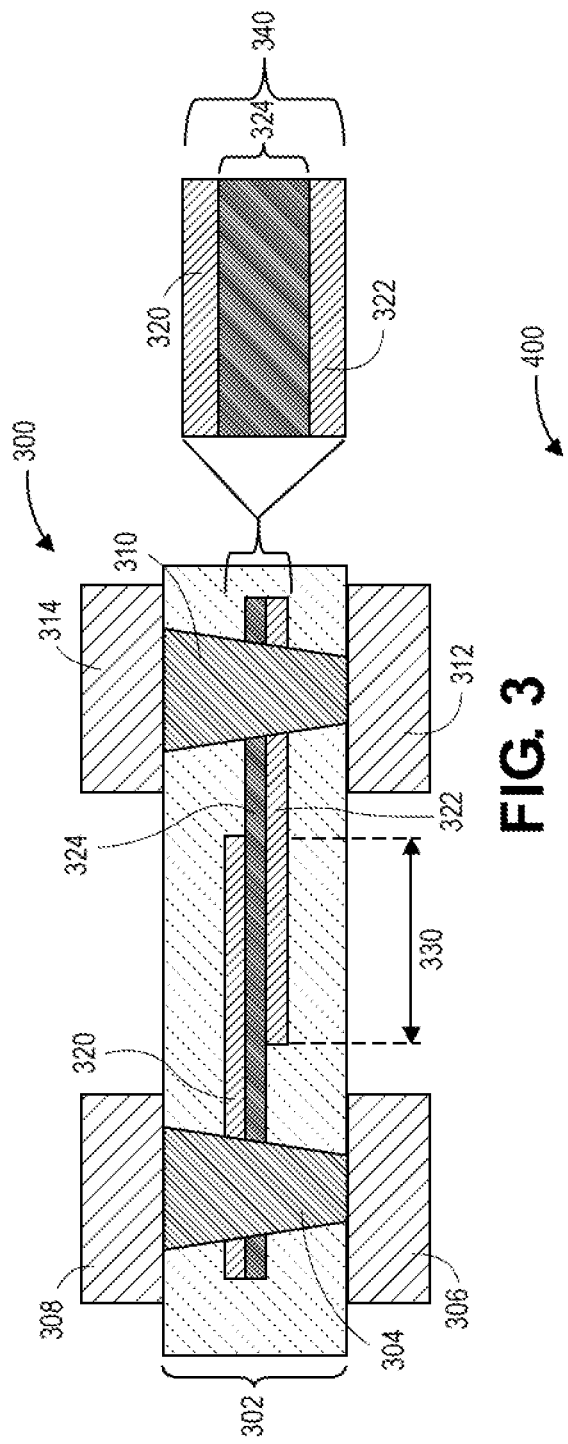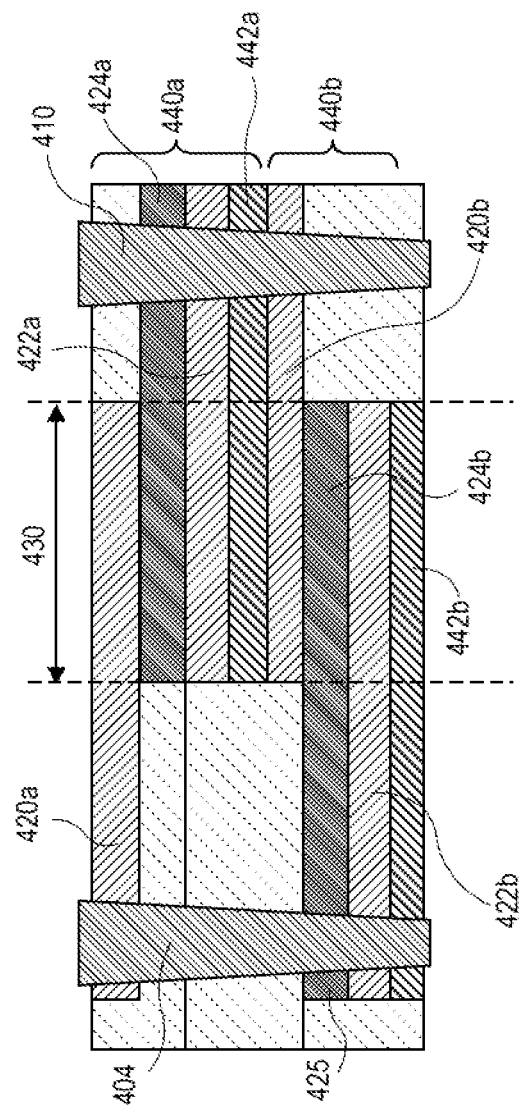
FIG. 3
FIG. 4

CAPACITOR WITH DUAL DIELECTRIC LAYERS

FIELD

Embodiments of the present disclosure generally relate to the field of semiconductors, and in particular to metal-insulator-metal (MIM) capacitors.

BACKGROUND

Continued growth in virtual machines, cloud computing, and portable devices will continue to increase the demand for high capacitance density within chips and packages.

BRIEF DESCRIPTION OF THE DRAWINGS

FIG. 3 illustrates a cross section side view of a two plate metal-insulator-metal (MIM) capacitor, in accordance with various embodiments.

FIG. 4 illustrates a cross section side view of a stacked MIM capacitor, in accordance with various embodiments.

DETAILED DESCRIPTION

Figure 1:
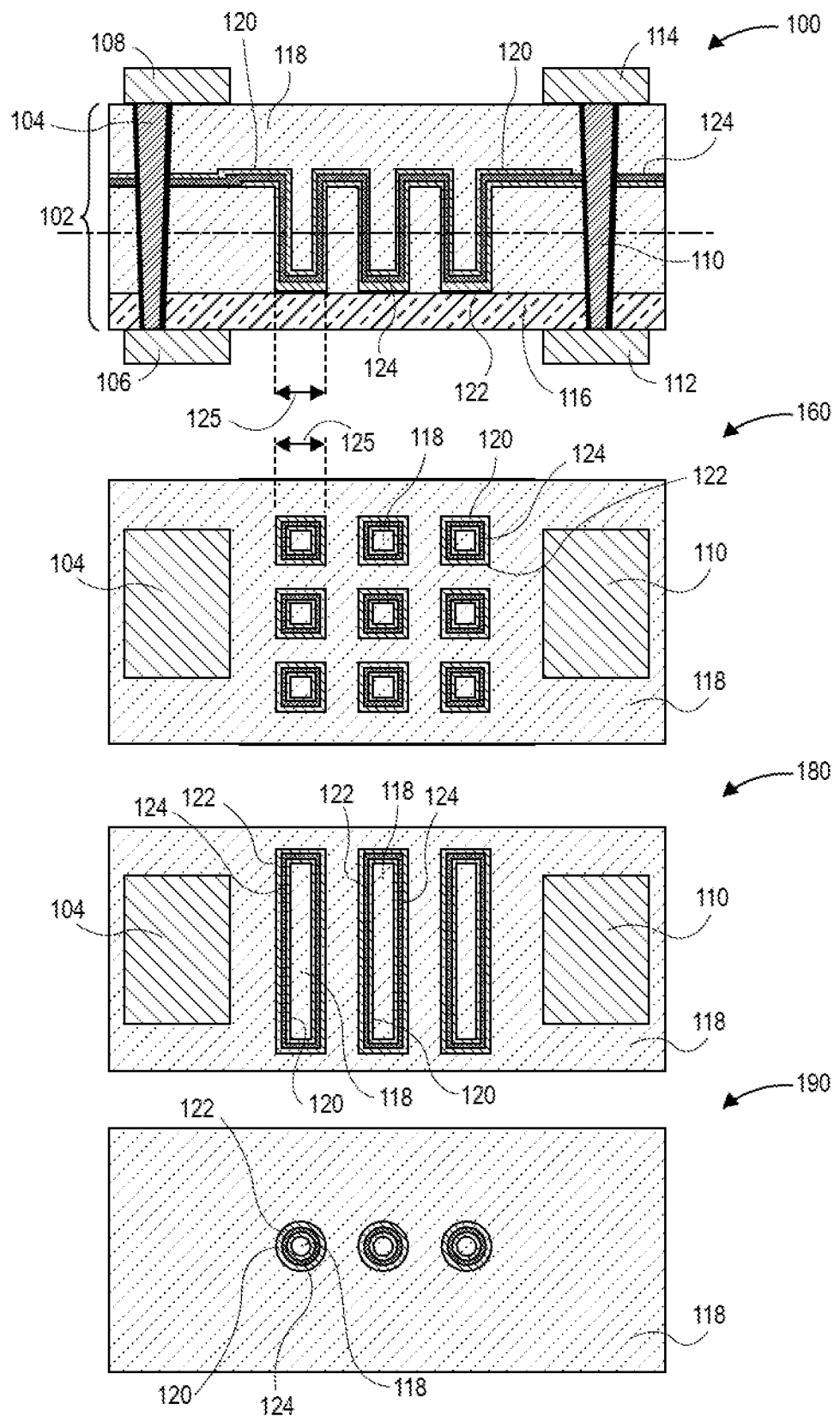
FIG. 1 illustrates a cross section side view and various top-down views of a capacitor within a core, in accordance with various embodiments.

Embodiments described herein may be related to apparatuses, processes, and techniques directed to increasing the capacitance density of MIM capacitors on dies or within packages. Embodiments may be directed to complementary metal-oxide-semiconductor (CMOS) technology. Embodiments include a MIM stack with multiple insulator layers, which may also be referred to as multiple dielectric layers, between the metal, in order to increase the dielectric constant of the MIM stack. In particular, these multiple dielectric layers may include a first dielectric layer that includes barium, strontium, titanium, and oxygen that is coupled with a second dielectric layer that includes strontium, titanium, and oxygen. In embodiments, the second dielectric layer will assist in crystallization of the first dielectric layer, that includes barium, at a lower temperature.

In legacy implementations, strontium, titanium, and oxygen may have been used as part of the dielectric, however in these legacy implementations, the dielectric constant, or "k" is less than 200, and more typically around 120. In legacy implementations, attempts to increase dielectric constant have included decreasing the thickness of the strontium, titanium, and oxygen dielectric layer. Although with these legacy approaches some increasing capacitance may be achieved, the amount of electrical leakage increases and that reduces the effectiveness of the capacitor.

In embodiments described herein, additional layers may also be included as discussed further below, for example by adding a separate iridium layer next to a metal layer, and/or adding a separate dielectric layer that includes hafnium and oxygen, or aluminum and oxygen to further increase the dielectric constant of the MIM capacitor and reduce leakage respectively. It should also be appreciated that embodiments of the MIM capacitor described herein may be implemented at the die level, or within a substrate at the package level.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a cross section side view and various top-down views of a capacitor within a core, in accordance with various embodiments. Diagram 100 shows a cross section side view of a MIM that includes a first metal layer 120 and a second metal layer 122 that are separated by layers of dielectric 124. The first metal layer 120 may be electrically coupled with a first electrical contact 104, which may be electrically and/or physically coupled with pads 106, 108 on either side of a core 102. The second metal layer 122 may be electrically coupled with a second electrical contact 110, which may be electrically and/or physically coupled with pads 112, 114 on either side of the core 102.

In embodiments, the core 102 may include a first insulator 116 and a second insulator 118 that surrounds the first metal layer 120, second metal layer 122, and layers of dielectric 124. In embodiments, the first insulator 116 and the second insulator 118 may be made of the same or similar materials. In embodiments, the diagram 100 may show a part of a MIM capacitor on a die structure, such as a CPU, or may be part of another component of a package, for example on a substrate of a package.

In embodiments, the layers of dielectric 124 may include the layers discussed below, and in particular with respect to FIGS. 5A-5C. As shown in diagram 100, the MIM may be fashioned in a structure that includes one or more trenches 125 to increase the overall area of the capacitive device.

Diagram 160 shows a top-down cross section view at the dashed line of diagram 100 that includes the first electrical contact 104 and the second electrical contact 110. Examples of trenches 125 may include multiple structures in an array, each with first metal layer 120, layers of dielectric 124, and second metal layer 122 that may surround the second insulator 118.

Diagram 180 shows a different top-down cross section view where the features that form the trenches 125 may be long rectangles that include first metal layer 120, layers of dielectric 124, and second metal layer 122 that may surround the second insulator 118.

Diagram 190 shows a different top-down cross section view with the features that form the trenches 125 may be circular (as shown), or may be elliptical, that include first metal layer 120, layers of dielectric 124, and second metal layer 122 that may surround the second insulator 118. It should be appreciated that the MIM first metal layer 120, layers of dielectric 124, and second metal layer 122 may take on a variety of different shapes depending upon the size and performance characteristics desired of the MIM capacitor, as discussed further below.

Figure 2:
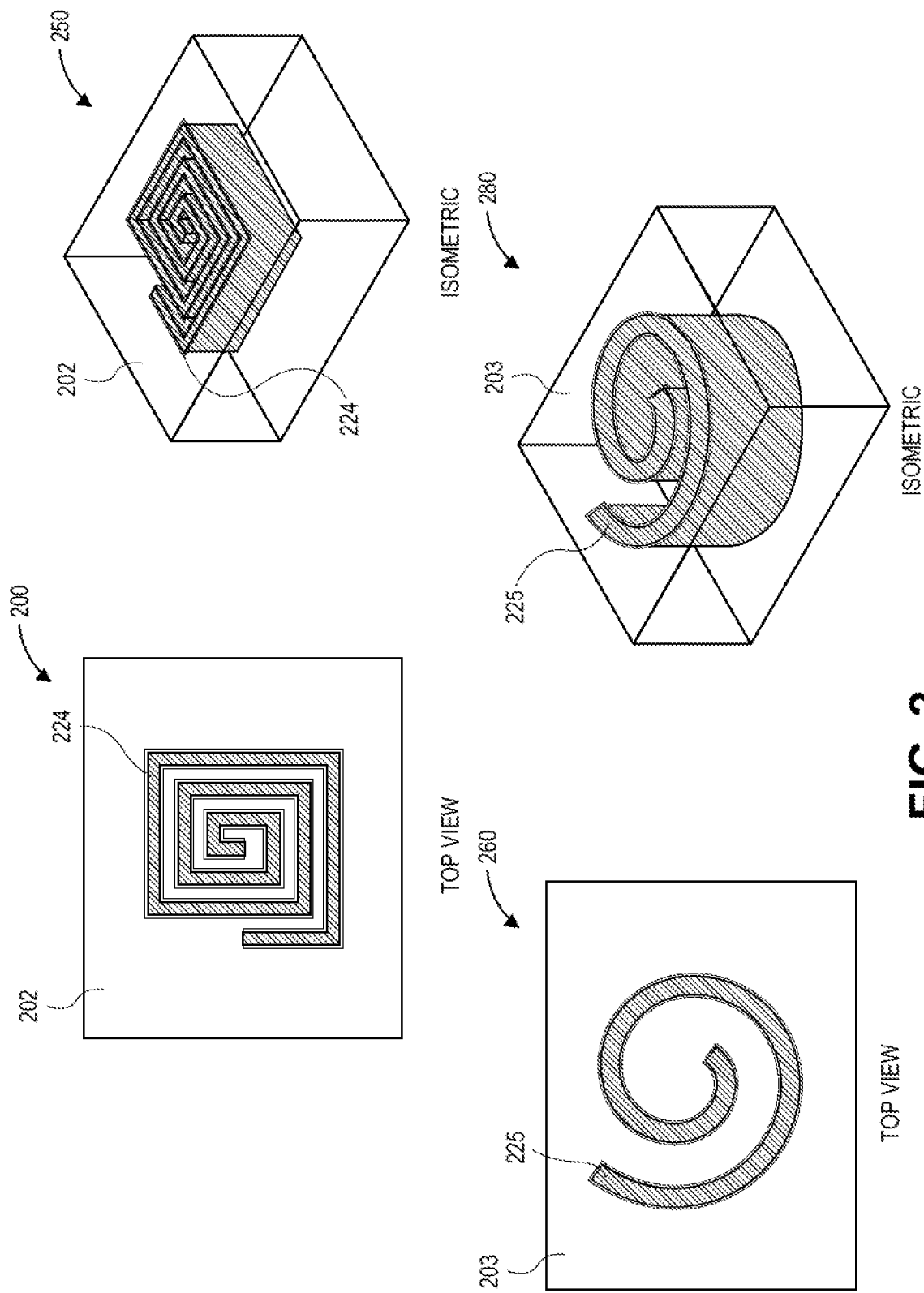
FIG. 2 illustrates top-down views and perspective views of patterns of one or more dielectric layers within a capacitor, in accordance with various embodiments.

FIG. 2 illustrates top-down views and perspective views of patterns of one or more dielectric layers within a capacitor, in accordance with various embodiments. Diagram 200 shows a top-down view of a structure for layers of dielectric 224, which may be similar to layers of dielectric 124 of FIG. 1, in accordance with various embodiments. In this example, the core 202, which may be similar to core 102 of FIG. 1, may be an insulator, dielectric, a glass core or glass layer into which trenches may be manufactured, and metal layers such as first metal layer 120, second metal layer 122, as well as layers of dielectric 224 may be deposited. Diagram 200 shows the layers of dielectric 224 structured in a square figure that wraps around itself, as can be more readily seen with respect to diagram 250.

Diagram 260 shows a top-down view of the structure of a spiral form for the layers of dielectric 225, which may be similar to layers of dielectric 224, within a core 203, which may be similar to core 202. Core 203 may be a glass core. Diagram 280 shows a perspective view of diagram 260. Note with respect to FIG. 2, only the layers of dielectric 224, 225 are shown. The first metal layer, such as first metal layer 120 and the second metal layer such as second metal layer 122 that would be on either side of the layers of dielectric 224, 225 are not shown for clarity.

FIG. 3 illustrates a cross section side view of a two-plate metal-insulator-metal (MIM) capacitor, in accordance with various embodiments. Diagram 300 shows a MIM, which may also be referred to as a two plate MIM, that includes a first metal layer 320 and a second metal layer 322 that are separated by layers of dielectric 324, which may be similar to first metal layer 120, second metal layer 122, and layers of dielectric 124 of FIG. 1. The first metal layer 320, the layers of dielectric 324, and the second metal layer 322 may be referred to as a MIM stack 340.

The first metal layer 320 may be electrically coupled with a first electrical contact 304 which may be electrically and/or physically coupled with pads 306, 308 on either side of a core 302, which may be similar to first electrical contact 104, pads 106, 108, and core 102 of FIG. 1. Similarly, the second metal layer 322 may be electrically coupled with a second electrical contact 310 which may be electrically and/or physically coupled with pads 312, 314 on either side of the core 302. These may be similar to second electrical contact 110, and pads 112, 114 of FIG. 1. As shown, an area of overlap 330 where the first metal layer 320 and the second metal layer 322 overlap, may be referred to as an active portion of the MIM stack 340. In embodiments, the area of overlap 330 may form an area of at least 50 μm×50 μm.

FIG. 4 illustrates a cross section side view of a stacked MIM capacitor, in accordance with various embodiments. Diagram 400 shows a cross-section of two MIMs 440a, 440b stacked on top of each other in a layered configuration. A first electrical contact 404, and a second electrical contact 410, which may be similar to first electrical contact 104 and second electrical contact 110 of FIG. 1, are shown.

The first electrical contact 404 may be electrically coupled with the first metal layer 420a of MIM 440a, and may also be electrically coupled with the second metal layer 422b of MIM 440b. The second electrical contact 410 may be electrically coupled with the second metal layer 422a of MIM 440a, and may also be electrically coupled with the first metal layer 420b of MIM 440b. Below the second metal layer 422b there may be a seeding layer 442b that may be used to grow, or otherwise to build up the second metal layer 422b. Similarly, below the second metal layer 422a there may be a seeding layer 442a that may be used to grow, or otherwise to build up the second metal layer 422a.

Layers of dielectric 424a is positioned between the first metal layer 420a and second metal layer 422a, and layers of dielectric 424b is positioned between the first metal layer 420b and second metal layer 422b. Note that the area overlap 430, which may be similar to the area of overlap 330 of FIG. 3, includes an active portion of the capacitor structure shown in diagram 400. The layers of dielectric 424a, 424b are discussed further below. Embodiments may be implemented in a multi-plate application.

Figure 5A:
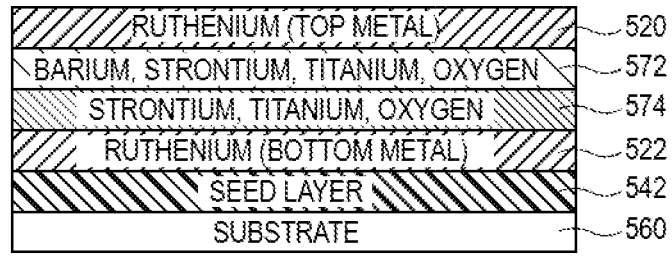
FIGS. 5A-5C illustrate various layers of a stacked MIM capacitor, in accordance with various embodiments.
Figure 5B:
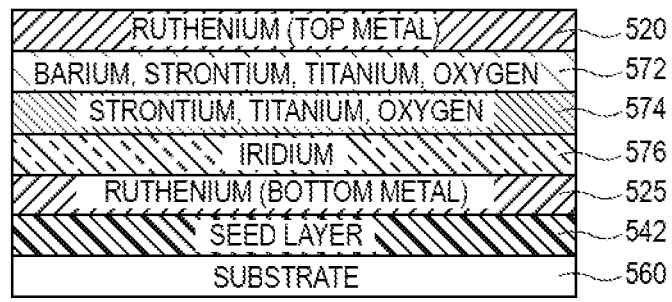
Figure 5C:
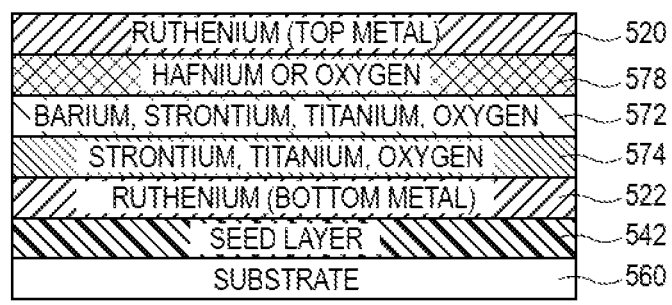

FIGS. 5A-5C illustrate various layers of a stacked MIM capacitor, in accordance with various embodiments. FIG. 5A shows an example of a MIM stack that may be similar to MIM stack 340 of FIG. 3. FIG. 5A shows a first metal layer 520, which may be referred to as a top electrode and which may be similar to first metal layer 320 of FIG. 3, and a second metal layer 522, which may be similar to second metal layer 322 of FIG. 3. In some embodiments, a thickness of the first metal layer 520 and/or the second metal layer 522 may be approximately 20 nm. In between the first metal layer 520 and the second metal layer 522 are a first dielectric layer 572 and a second dielectric layer 574.

The second dielectric layer 574 may include strontium, titanium, and oxygen. In embodiments, the second dielectric layer 574 may include $SrTiO_3$. In embodiments, a thickness of the second dielectric layer 574 may range from 1 nm to 10 nm.

The first dielectric layer 572 may include barium, in addition to strontium, titanium, and oxygen (BSTO). In embodiments, the second dielectric layer 574 may serve as a seed layer for BSTO of the first dielectric layer 572, and enables the BSTO in the first dielectric layer 572 to crystalize at a lower deposition temperature, for example around 400° C. to 450° C. Crystallization of BSTO in perovskite phase enables a higher dielectric constant. In embodiments, a composition of the first dielectric layer 572 may include $Ba_{0.4}Sr_{0.6}TiO_3$. The crystallization of the first dielectric layer 572 is significant in providing a higher dielectric constant, which enables capacitor with a higher dielectric constant. In embodiments, the barium content within the BSTO may be around the 8% range.

A thickness of the first dielectric layer 572 may range between 10 nm and 30 nm for an on-die capacitor. These thicknesses may be higher if lower current leakage is required during capacitor operation. The first dielectric layer 572 may have different concentrations of barium. In embodiments, a composition of the first dielectric layer 572 may include $Ba_xSr_yTiO_3$, where x may range from 0.1 to 0.6, and y may range from 0.4 to 0.9, where x and y added together equal one.

The second metal layer 522, which may be referred to as the bottom electrode, may include ruthenium in order to facilitate good crystallization when the second dielectric layer 574 is applied. In embodiments, ruthenium may be a preferred metal due to its ability to integrate with existing manufacturing processes, including the property that ruthenium can be etched. In embodiments iridium or platinum may be used as well in the second metal layer 522. In embodiments, the second metal layer 522 may also include $SrRuO_3$ and $LaNiO_3$.

In embodiments, a seed layer 542, that may include tungsten, tantalum and/or titanium, may be used to grow the second metal layer 522. In embodiments, the seed layer 542 may have a thickness of around 1 nm. A substrate 560 may represent any substrate, which may be organic or glass, onto which the MIM capacitor may be physically attached. The substrate 560, in addition to the seed layer 542, may be detached prior to final placement of the MIM capacitor in some applications.

FIG. 5B shows an example of a MIM stack that may be similar to FIG. 5A, but with another metal layer 576 positioned next to and above the second metal layer 525, which may be similar to second metal layer 522 of FIG. 5A. In embodiments, the other metal layer 576 may include iridium, which enables better crystallization of layer 574 due to better lattice matching to the strontium, titanium, oxygen in layer 574. Better crystallization of layer 574 improves the crystallization of layer 572. This effect further increases the dielectric constant of layer 572. In addition, second metal layer 525 may be thinner, on the order of 10 nm versus 20 nm for second metal layer 522 of FIG. 5A, and the other metal layer 576 may be on the order of 10 nm. Thus, in embodiments, the thickness of the other metal layer 576 added to the thickness of the second metal layer 525 may be on the order of a same thickness of second metal layer 522 of FIG. 5A.

FIG. 5C shows an example of a MIM stack that may be similar to FIG. 5A, where an additional layer 578 of hafnium oxide $HfO_2$, or aluminum oxide $Al_2O_3$ may be added below the first metal layer 520. The introduction of the additional layer 578 may be used to further reduce electrical leakage, and to facilitate an overall thinner MIM stack. The thickness of these layer could be from 0.2 nm to 5 nm. Typically these layers are amorphous and have a lower dielectric constant like ~10-25.

Figure 6:
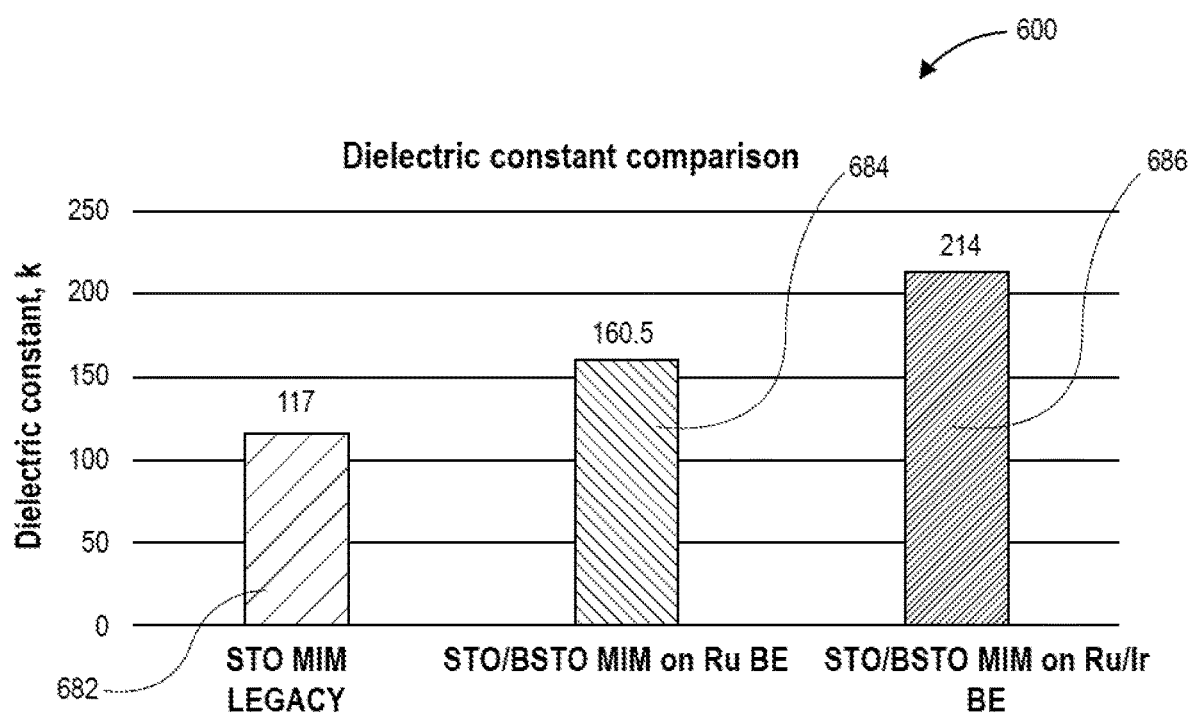
FIG. 6 is a graph that illustrates various dielectric constant values as shown with respect to FIGS. 5A-5C, in accordance with various embodiments.

FIG. 6 is a graph that illustrates various dielectric constant values as shown with respect to FIGS. 5A-5C, in accordance with various embodiments. Graph 600 is a bar graph that shows the relationship between a dielectric constant, or k value for various MIM stack implementations.

Bar 682 of graph 600 shows a dielectric constant value of 117 for a legacy implementation of a MIM stack that only includes $SrTiO_3$ as the sole dielectric layer. Bar 684 of graph 600 shows a dielectric constant value of 160.5 for an implementation similar to that shown in FIG. 5A, that includes a first dielectric layer 572 that includes barium, strontium, titanium, and oxygen on top of a second dielectric layer 574 that include strontium, titanium, and oxygen. Inclusion of barium enhances the dielectric constant of the strontium, titanium, oxygen layer, hence provides more capacitance in the MIM stack.

Bar 686 of graph 600 shows a dielectric constant value of 214 for an implementation similar to that shown in FIG. 5B, with a layer of iridium 576 positioned above the second metal layer 525. In embodiments, the layer of iridium 576 may cause better crystallization in the second dielectric layer 574 and that improves the crystallization of layer 572 which includes barium.

Figure 7:
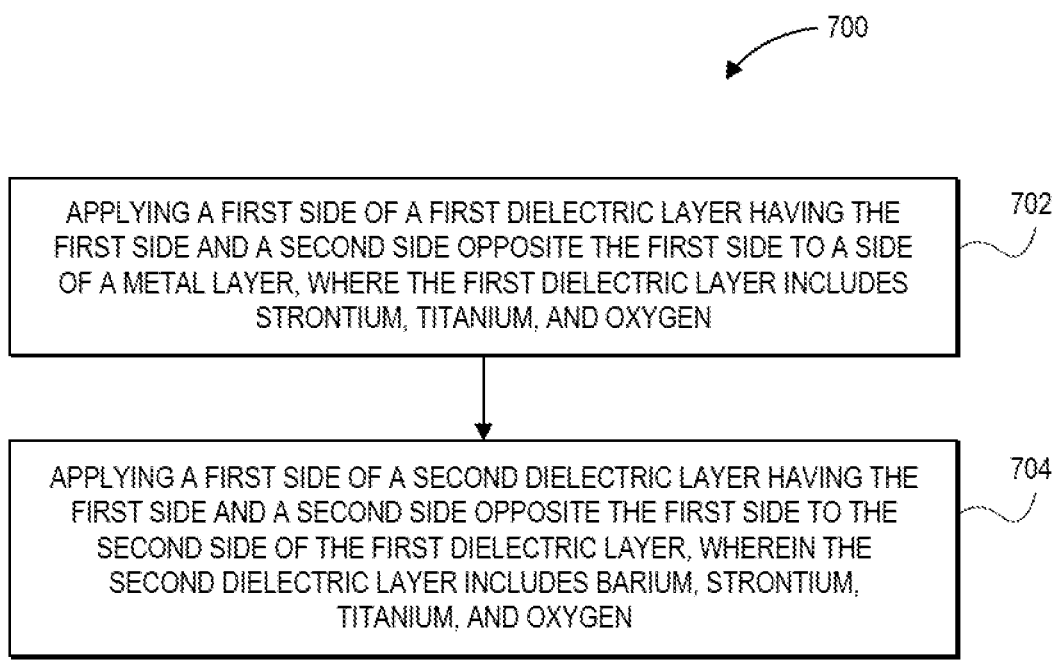
FIG. 7 illustrates an example process for manufacturing a transistor structure with metal gate cuts across adjacent gates that include dielectric refill and TCN between the adjacent gates, in accordance with various embodiments.

FIG. 7 illustrates an example process for creating a capacitor with dual layers that include strontium, titanium, and barium, in accordance with various embodiments. Process 700 may be implemented using the embodiments and techniques described herein, and in particular to those with respect to FIGS. 1-6.

At block 702, the process may include applying a first side of a first dielectric layer having the first side and a second side opposite the first side to a side of a metal layer, where the first dielectric layer includes strontium, titanium, and oxygen.

At block 704, the process may further include applying a first side of a second dielectric layer having the first side and a second side opposite the first side to the second side of the first dielectric layer, wherein the second dielectric layer includes barium, strontium, titanium, and oxygen.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
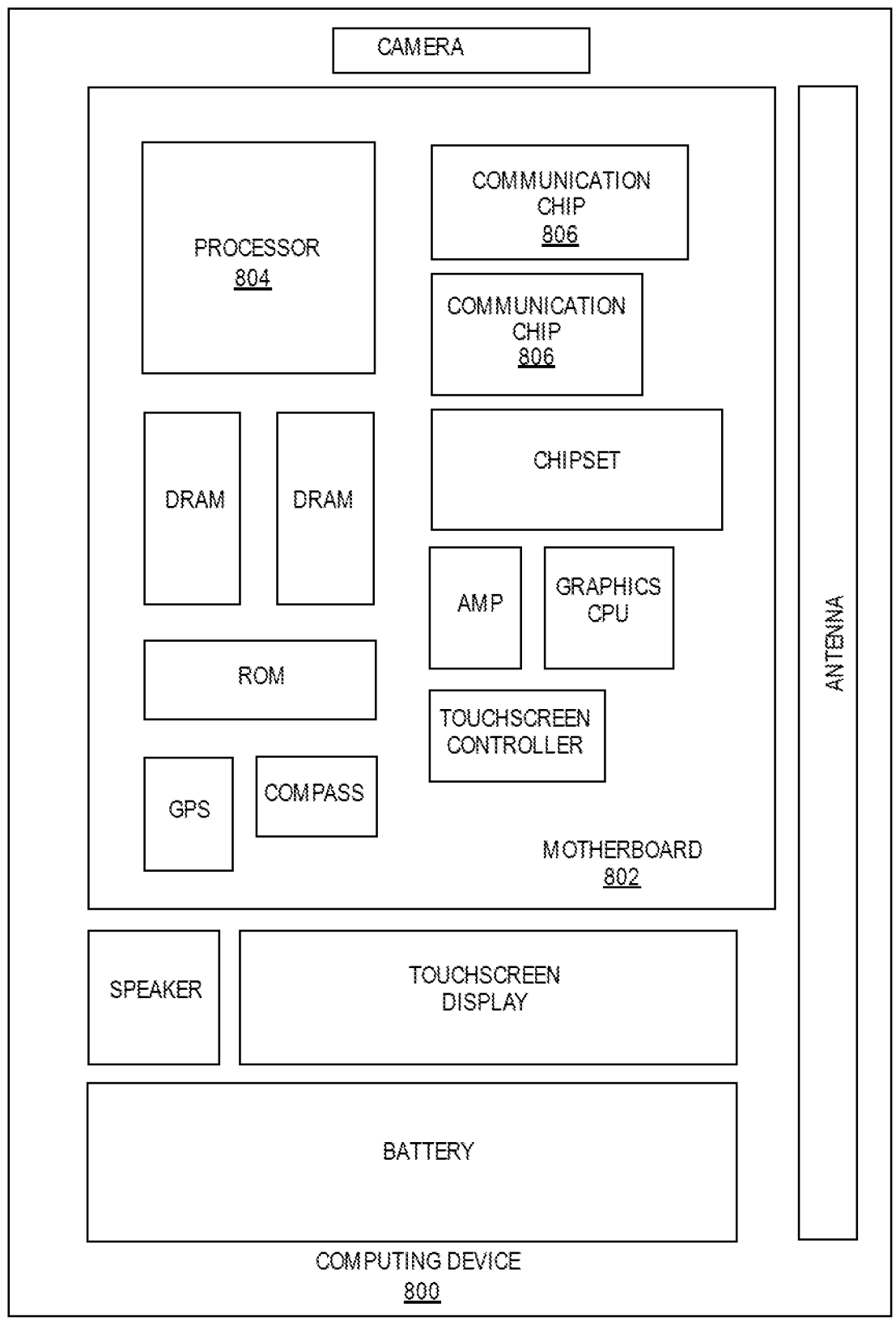
FIG. 8 illustrates a computing device 800 in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
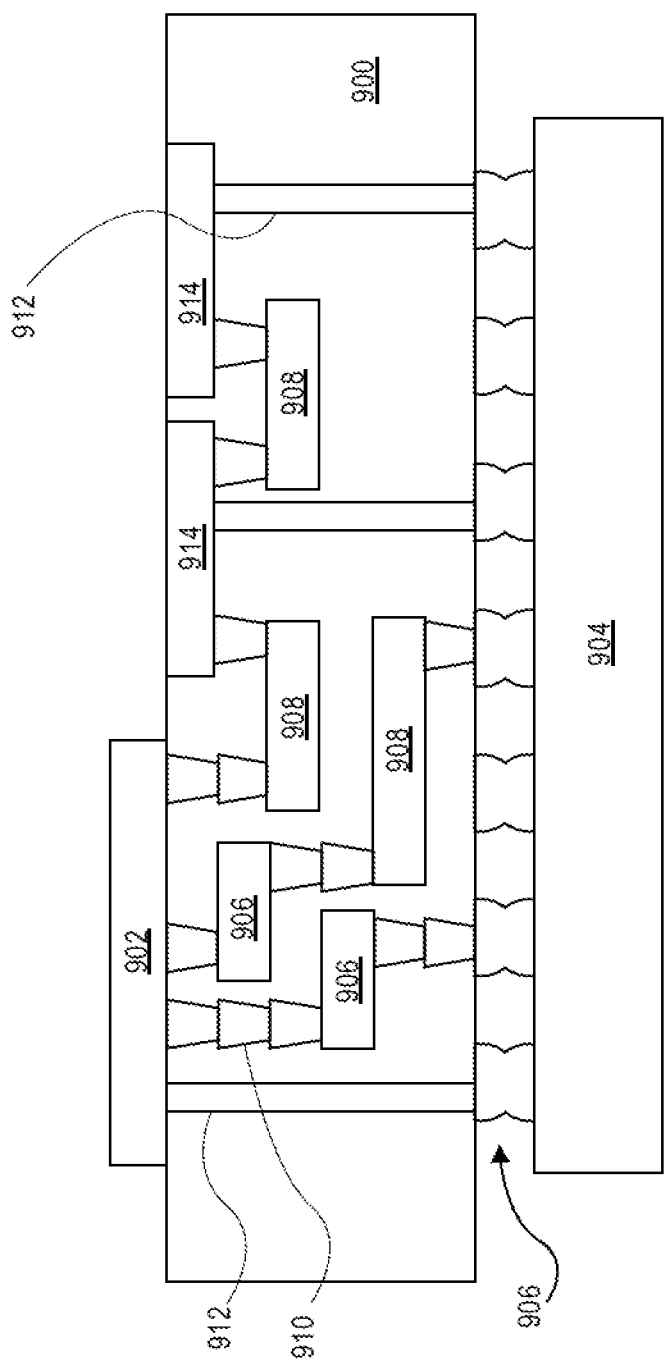
FIG. 9 illustrates an interposer 900 that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a capacitor comprising: a metal layer; a first dielectric layer having a first side and a second side opposite the first side, the first side of the first dielectric layer is physically coupled with a side of the first metal layer, wherein the first dielectric layer includes a selected one or more of: strontium, titanium, and oxygen; and a second dielectric layer having a first side and a second side opposite the first side, the first side of the second dielectric layer is physically coupled with the second side of the first dielectric layer, wherein the second dielectric layer includes a selected one or more of: barium, strontium, titanium, and oxygen.

Example 2 includes the capacitor example 1, wherein the metal layer is a first metal layer; and further comprising a second metal layer with a side physically coupled with the second side of the second dielectric layer.

Example 3 includes the capacitor of example 2, wherein the second metal layer includes ruthenium.

Example 4 includes the capacitor of example 1, wherein the metal layer includes ruthenium or iridium.

Example 5 includes the capacitor of example 1, wherein the side of the metal layer is a first side; and further comprising a second side of the metal layer opposite the first side, wherein a thickness of the metal layer from the first side to the second side ranges from 1 nm to 100 nm.

Example 6 includes the capacitor of example 1, further comprising another dielectric layer with a first side and a second side opposite the first side, wherein the other dielectric layer is between the metal layer and the first dielectric layer, wherein the first side of the other dielectric layer is coupled with the metal layer and the second side of the other dielectric layer is coupled with the first side of the first dielectric layer, and wherein the other dielectric layer includes barium.

Example 7 includes the capacitor of example 6, wherein a thickness of the other dielectric layer ranges from 1 nm to 100 nm.

Example 8 includes the capacitor of example 1, further comprising another dielectric layer having a first side and a second side opposite the first side, the first side of the other dielectric layer coupled with the second side of the second dielectric layer, wherein the other dielectric layer includes a selected one or more of: hafnium, oxygen or aluminum.

Example 9 includes the capacitor of example 8, wherein a thickness of the other dielectric layer between the first side in the second side ranges from 0.2 nm to 5 nm.

Example 10 includes the capacitor of any one of examples 1-9, wherein the side of the metal layer is a first side; and further comprising: a second side of the metal layer opposite the first side; and another layer coupled with the second side of the metal layer, wherein the other layer includes tantalum or titanium.

Example 11 includes the capacitor of example 10, wherein a thickness of the other layer ranges from 0.5 nm to 20 nm.

Example 12 includes the capacitor of example 10, wherein the other layer is coupled with a substrate.

Example 13 is a method comprising: applying a first side of a first dielectric layer having the first side and a second side opposite the first side to a side of a metal layer, wherein the first dielectric layer includes strontium, titanium, and oxygen; and applying a first side of a second dielectric layer having the first side and a second side opposite the first side to the second side of the first dielectric layer, wherein the second dielectric layer includes barium, strontium, titanium, and oxygen.

Example 14 includes the method of example 13, wherein a thickness between the first side of the first dielectric layer and the second side of the first dielectric layer ranges from 1 nm to 10 nm.

Example 15 includes the method of example 13, wherein a thickness between the first side of the second dielectric layer and the second side of the second dielectric layer ranges from 10 nm to 30 nm.

Example 16 includes the method of example 13, further comprising applying a first side of a third dielectric layer having the first side and a second side opposite the first side to the second side of the second dielectric layer, wherein the third dielectric layer includes a selected one or more of: hafnium and oxygen, or aluminum and oxygen.

Example 17 includes the method of example 16, wherein a thickness of the third dielectric layer from the first side of the third dielectric layer to the second side of the third dielectric layer ranges from 0.2 nm to 5 nm.

Example 18 includes the method of any one of examples 13-17, wherein the metal layer is a first metal layer, and further comprising: applying a side of a second metal layer to the second side of the second dielectric layer.

Example 19 includes the method of example 18, wherein the second metal layer includes ruthenium.

Example 20 includes the method of example 19, wherein a thickness of the second metal layer ranges from 5 nm to 100 nm.

Example 21 is a package comprising: a substrate; and a capacitor coupled with the substrate, the capacitor comprising: a first metal layer that includes ruthenium or iridium; a first dielectric layer having a first side and a second side opposite the first side, the first side of the first dielectric layer is physically coupled with a side of the first metal layer, wherein the first dielectric layer includes strontium, titanium, and oxygen; a second dielectric layer having a first side and a second side opposite the first side, the first side of the second dielectric layer is physically coupled with the second side of the first dielectric layer, wherein the second dielectric layer includes barium, strontium, titanium, and oxygen; and a second metal layer that includes ruthenium, the second metal layer coupled with the second side of the second dielectric layer.

Example 22 includes the package of example 21, wherein the first metal layer has a first side and a second side opposite the first side, wherein the second side of the first metal layer is coupled with the first side of the first dielectric layer, and wherein the substrate is coupled with the first side of the first metal layer.

Example 23 includes the package of example 22, further comprising another layer between the first metal layer and the substrate, the other layer having a first side and a second side opposite the first side, wherein the first side of the other layer is coupled with the substrate and wherein the second side of the other layer is coupled with the first side of the first dielectric layer.

Example 24 includes the package of example 23, wherein the other layer includes tantalum or titanium and has a thickness between the first side and the second side that ranges from 0.5 nm to 20 nm.

Example 25 includes the package of any one of examples 21-24, wherein the capacitor has a K value of greater than 160.

What is claimed is:
1. A capacitor comprising:
a first metal layer;
a first dielectric layer on the first metal layer, the first dielectric layer comprising strontium, titanium, and oxygen;
a second dielectric layer on the first dielectric layer, the second dielectric layer comprising barium, strontium, titanium, and oxygen; and
a third dielectric layer on the second dielectric layer, the third dielectric layer comprising hafnium and oxygen.

2. The capacitor claim 1, further comprising a second metal layer over the third dielectric layer.

3. The capacitor of claim 2, wherein the second metal layer includes ruthenium.

4. The capacitor of claim 1, wherein the first metal layer includes ruthenium or iridium.

5. The capacitor of claim 1, wherein a thickness of the first metal layer ranges from 1 nm to 100 nm.

6. The capacitor of claim 1, wherein a thickness of the third dielectric layer ranges from 0.2 nm to 5 nm.

7. The capacitor of claim 1, further comprising:
another layer beneath and coupled with the first metal layer, wherein the other layer includes tantalum or titanium.

8. The capacitor of claim 7, wherein a thickness of the other layer ranges from 0.5 nm to 20 nm.

9. The capacitor of claim 7, wherein the other layer is coupled with a substrate.

10. A package comprising:
a substrate; and
a capacitor coupled with the substrate, the capacitor comprising:
a first metal layer that includes ruthenium or iridium;
a first dielectric layer on the first metal layer, the first dielectric layer comprising strontium, titanium, and oxygen;
a second dielectric layer on the first dielectric layer, the second dielectric layer comprising barium, strontium, titanium, and oxygen;
a third dielectric layer on the second dielectric layer, the third dielectric layer comprising hafnium and oxygen; and
a second metal layer that includes ruthenium, the second metal layer over the third dielectric layer.

11. The package of claim 10, wherein the first metal layer has a first side and a second side opposite the first side, wherein the second side of the first metal layer is coupled with the first dielectric layer, and wherein the substrate is coupled with the first side of the first metal layer.

12. The package of claim 11, further comprising another layer between the first metal layer and the substrate, the other layer having a first side and a second side opposite the first side, wherein the first side of the other layer is coupled with the substrate and wherein the second side of the other layer is coupled with the first side of the first dielectric layer.

13. The package of claim 12, wherein the other layer includes tantalum or titanium and has a thickness between the first side and the second side that ranges from 0.5 nm to 20 nm.

14. The package of claim 10, wherein the capacitor has a K value of greater than 160.

* * * * *